United States Patent [19]

Yoshikawa

[11] Patent Number: 5,057,786
[45] Date of Patent: Oct. 15, 1991

[54] QUADRATURE AMPLITUDE MODULATION WAVE DEMODULATOR PROVIDED WITH BAND-PASS FILTERS FOR FIXED EQUALIZER

[75] Inventor: Syuuichi Yoshikawa, Nara, Japan

[73] Assignee: Sharp Kabushiki Kaisha, Osaka, Japan

[21] Appl. No.: 540,788

[22] Filed: Jun. 20, 1990

[30] Foreign Application Priority Data

Jun. 22, 1989 [JP] Japan ................................. 1-160502

[51] Int. Cl.$^5$ .............................................. H03D 3/00
[52] U.S. Cl. ....................................... 329/304; 375/39
[58] Field of Search ................... 329/304, 345; 375/39

[56] References Cited

U.S. PATENT DOCUMENTS 4,849,706  7/1989  Davis et al. ........................ 329/304
4,871,974  10/1989  Davis et al. ...................... 329/304 X Primary Examiner—Robert J. Pascal

[57] ABSTRACT

A quadrature amplitude modulation wave demodulator which includes a fixed equalizer having a first band-pass filter applied with a quadrature amplitude modulation wave reception signal for outputting an in-phase component with respect to a carrier wave for the reception signal, and a second band-pass filter applied with the reception signal for outputting a quadrature component with respect to the carrier wave for the reception signal. There is provided a vector multiplication section for performing vector multiplication between one vector having outputs of the first and second band-pass filters as two components, and another vector having two reference carrier waves in quadrature to each other as two components.

7 Claims, 4 Drawing Sheets

QUADRATURE AMPLITUDE MODULATION WAVE DEMODULATOR PROVIDED WITH BAND-PASS FILTERS FOR FIXED EQUALIZER

BACKGROUND OF THE INVENTION

The present invention generally relates to a demodulator and more particularly, to an orthogonal amplitude modulation wave demodulator. There are band-pass filters for a fixed equalizer to be employed in said orthogonal amplitude modulation wave demodulator.

In the present specification, a phase modulation wave is also considered to be one form of the quadrature amplitude modulation wave. Accordingly, the fixed equalizer and the quadrature modulated wave demodulator can also be utilized for the demodulation of the phase demodulation waves.

In demodulators to be used in communications for example, communications that are transmitted over wire or communication withouth wire (i.e. wireless), a fixed equalizer having a characteristic opposite to that of a communication line is incorporated in order to remove distortion produced by the characteristics inherent in the communication line.

A schematic block diagram for one example of conventional quadrature amplitude modulation wave demodulator is shown in FIG. 3. In FIG. 3 a digital signal processing technique is utilized, and this is normally realized by a digital signal processor (referred to as a DSP hereinafter).

In FIG. 3, the quadrature amplitude modulation wave demodulator includes a multiplication section for affecting multiplication between a diqital reoeption signal inputted to an input terminal 1 and two kinds of reference carrier waves in quadrature to each other. There is a filter section for effecting removal of a frequency component two times that of the carrier waves, and waveform shaping, with respect to the output of said multiplication section, and a low-pass filter type fixed equalizer for equalization of the communication line.

The multiplication section is provided with a reference carrier wave generator 2, a $\pi/2$ phase shifter 3, and two multipliers 4 and 5, the outputs of which are respectively applied to reception low-pass filters 6 and 7. The low-pass filters 6 and 7 normally having the same characteristics perform the removal of their frequency component two times that of the carrier waves produced by the multiplication between the input signal and reference carrier wave, and also perform the function of waveform shaping. The low-pass filter type fixed equalizer is provided with four low-pass filters 8,9,10 and 11, and adders 14 and 15. The low-pass filters 8 and 10 have the same characteristics , and the low-pass filters 9 and 11 also have the same characteristics. In this fixed equalizer, the vector calculation is executed for equalization of the circuit line with respect to a pair of outputs of the filter section. At the output terminals 16 and 17, the same component and the quadrature component as the result of demodulation are respectively outputted.

The low-pass filters 6 and 7 and the low pass filters 8,9 10 and 11 for the fixed equalizer are each normally realized by a finite impulse response type (referred to as FIR type hereinafter) digital filter, whose general construction is illustrated in FIG. 4. As shown in FIG .4, such FIR type digital filter includes gain tap factor memories 41, delay registers 42, multipliers 43, and an adder 44 connected to each other as illustrated.

Referring back to Fig.3, the conventional quadrature amplitude modulation wave demodulator includes six filters (i.e. the low-pass filters 6 and 7, and the low-pass filters 8,9, 10, and 11 for the equalization of the circuit lines). The calculating to be executed within the filter includes many multiplications and additions. Where the demodulator is to be used for example, by a DSP, a large load is applied to the DSP, thus requiring a high speed and large capacity DSP, which is naturally expensive.

SUMMARY OF THE INVENTION

Accordingly, an important object of the present invention is to provide a quadrature amplitude modulation wave demodulator provided with band-pass filters for a fixed equalizer employed therefor, which is capable of reducing burdens an its hardware for example a digital signal processor so as to result in by a less expensive hardware.

Another object of the present invention is to provide an quadrature amplitude modulation wave demodulator of the above described type which is simple in construction and stable in functioning at high reliability.

In accomplishing these and other objects, according to one preferred embodiment of the present invention, there is provided a quadrature amplitude modulation wave demodulator which includes a fixed equalizer having a first band-pass filter applied with an quadrature amplitude modulation wave reception signal for outputting an in-phase component with respect to a carrier wave for the reception signal. There is a second band-pass filter applied with the reception signal for outputting a quadrature component with respect to the carrier wave for the reception signal. Also included is a vector multiplication section for effecting vector multiplication between one vector having outputs of the first and second band-pass filters as two components, and another vector having two reference carrier waves in qudarature to each other as two components.

In the above described quadrature amplitude modulation wave demodulator, each of the first and second band-pass filters for the fixed equalizer has impulse response containing impulse response in which impulse response of the filter for compensating for characteristics of communication lines and impulse response of the reception filter are folded.

By the arrangement according to the present invention as described above, an improved quadrature amplitude modulation wave demodulator has been advantageously provided through simple construction, with substantial elimination of disadvantages inherent in the conventional arrangements of this kind.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
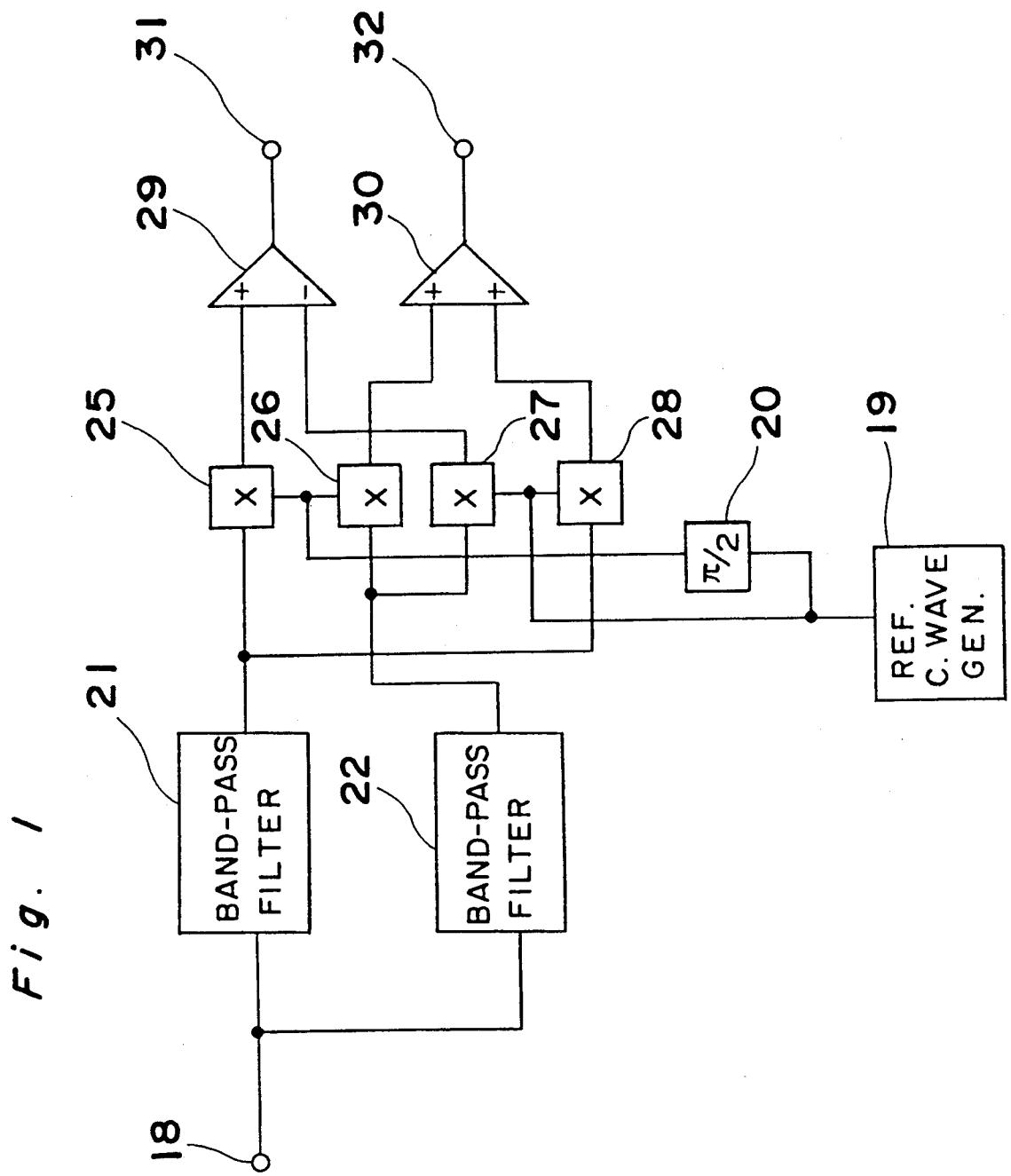
FIG. 1 is a block diagram showing construction of quadrature amplitude modulation wave demodulator provided with band-pass filters for a fixed equalizer according to one preferred embodiment of the present invention.

Before the description of the present invention proceeds, it is to be noted that like parts are designated by like reference numerals throughout the accompanying drawings.

Referring now to the drawings, there is shown in FIG. 1 an quadrature amplitude modulation wave demodulator according to one preferred embodiment of the present invention, which employs a digital signal processing technique so as to be used by for example quadrature a DSP (Digital Signal Processor) or the like.

In FIG. 1, the quadrature amplitude modulation wave demodulator generally includes a fixed equalizer having two band-pass filters 21 and 22 therefor coupled with two adders 29 and 30 through four multipliers 25, 26, 27, and 28 for a vector multiplication section, and a $\pi/2$ phase shifter 20 inserted between the multiplier 25 and a reference carrier wave generator 19, with the multiplier 27 being also connected to the reference carrier wave generator 19 as shown.

In the above arrangement, a digitalized reception signal applied to an input terminal 18 is applied to the two band-pass filters 21 and 22 for the fixed equalizer. These band-pass filters 21 and 22 are realized by FIR type digital filters. The output of the band-pass filter 21 is applied to the multipliers 25 and 28 of the vector multiplying section, while the output of the band-pass filter 22 is inputted to the multipliers 26 and 27 of said vector multiplying section. The multipliers 27 and 28 are also applied with a reference carried wave for demodulation outputted from the reference carrier wave generator 19, and the multipliers 25 and 26 are applied with a signal in which the reference carrier wave is subjected to phase shifting by the $\pi/2$ phase shifter 20.

The output of the multiplier 27 is subtracted from the output of the multiplier 25 by the adder 29, and thus, the in-phase component as a result of demodulation is obtained at an output terminal 31. Meanwhile the output of the multiplier 26 and the output of the multiplier 28 are added to each other by the adder 30, whereby quadrature component as a result of demodulation is obtained at an output terminal 32. In other words, by the vector multiplication circuit constituted by the multipliers 25, 26, 27, and 28 and the adders 29 and 30, the multiplication of the vector having the outputs of the band-pass filters 21 and 22 as two components, by the vector having two kinds of reference carrier waves different in phase from each other by $\pi/2$, is executed.

Figure 3:
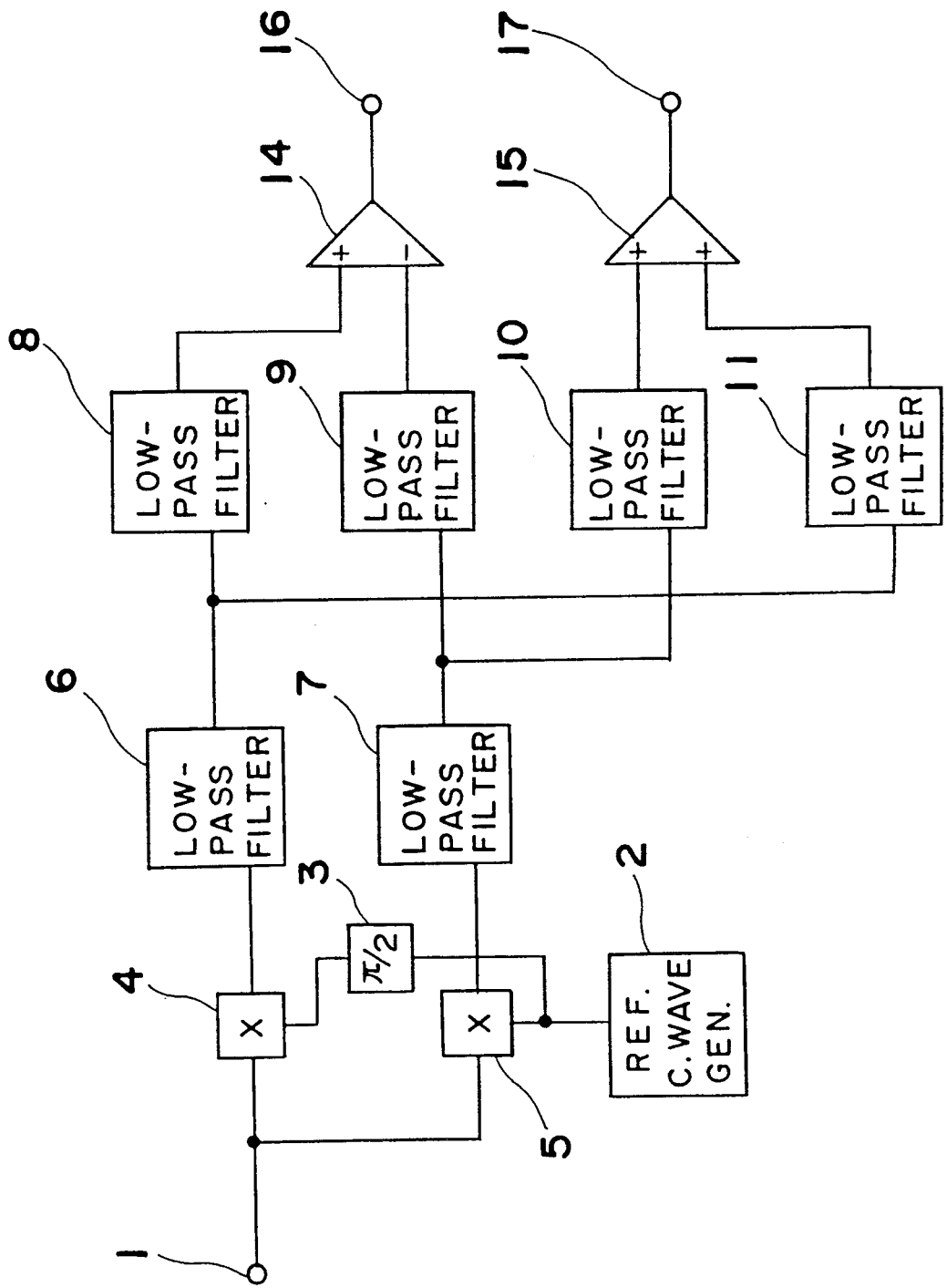
FIG. 3 is a block diagram showing one example of a conventional quadrature amplitude modulation wave demodulator (previously described)
Figure 4:
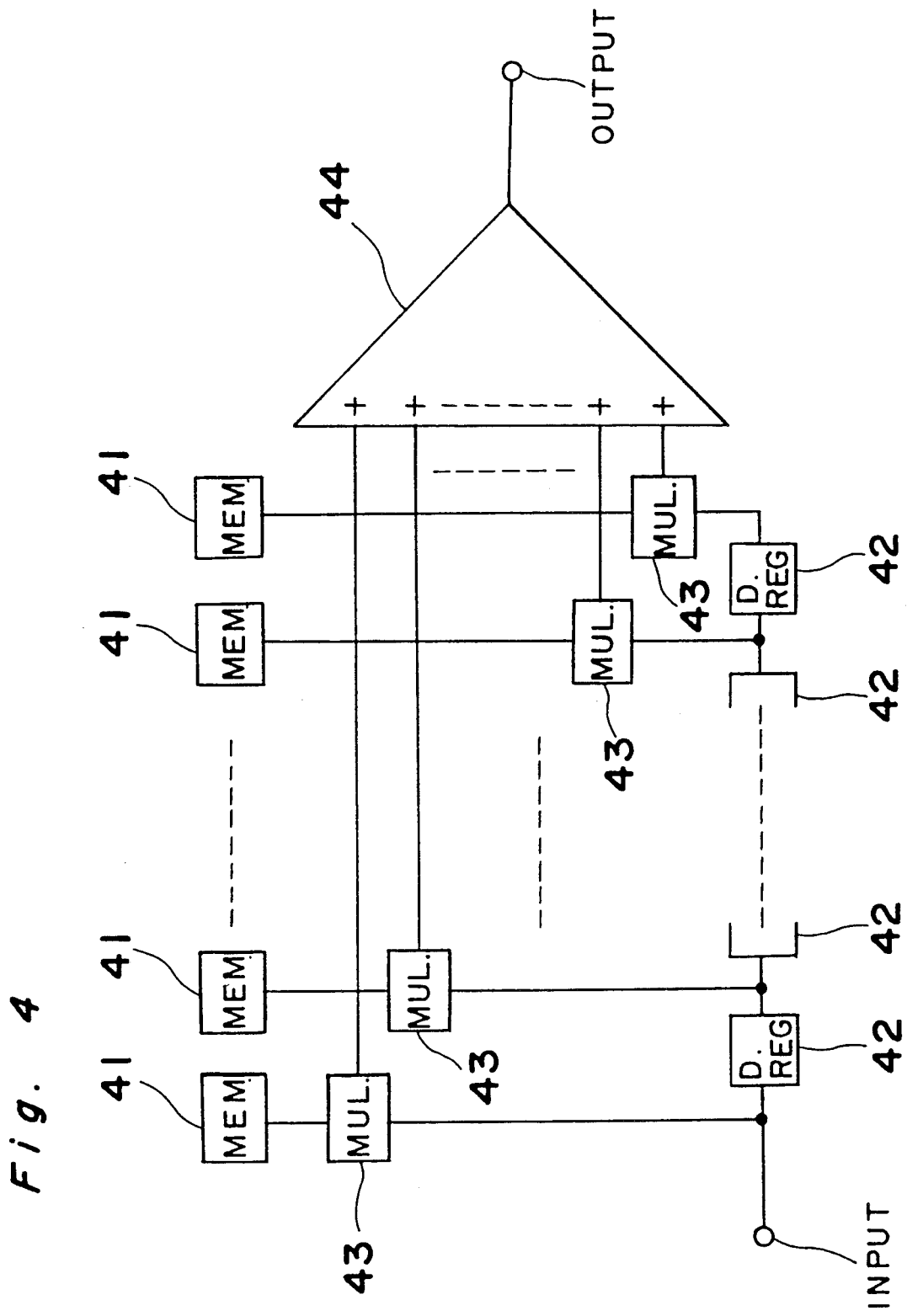
FIG. 4 is a block diagram showing a general construction of a FIR type digital filter.

In order to show that the demodulation of the quadrature amplitude modulation wave is possible by the demodulator according to the present invention, functioning of the conventional demodulator as shown in FIG. 3 will be described through employment of numerical formulas hereinafter.

In the quadrature amplitude modulation wave demodulator shown in FIG. 3, it is assumed that Sk represents a signal applied to the input terminal 1 at a time k, while Xk denotes signal pair outputted at the output terminals 16 and 17 as indicated by complex vector. Furthermore Hn represents the n-th impulse response of the low-pass filter 6 or 7, Cm shows a pair of m-th impulse responses of the low-pass filters 8 and 9 for the fixed equalizer (or the low-pass filters 10 and 11) by complex indication, and exp $(-j\omega ck)$ denotes the reference carrier wave for demodulation outputted from the reference carrier wave generator 2, and the output of said reference carrier wave through the $\pi/2$ phase shifter 3 simultaneously by complex indication.

In connection with the above, the relation is such that;

$$exp\ (-j\omega ck) = \cos\omega ck - j\sin\omega ck$$

where $\omega c$ is the angular frequency of the carrier wave.

On the assumption that impulse response to be obtained by folding impulse response of the low-pass filter 6 or 7 into that of the low-pass filters 8 and 9 (or low-pass filters 10, and 11) is denoted by Un, the relation is represented by;

$$Un = \sum_m Cm \cdot Hn\text{-}m \tag{1}$$

When the above equation (1) is more specifically represented, with the impulse responses of the band-pass filters 8 and 9 being indicated by C1m and C2m respectively, since Hn-m is of an actual number, the relation will be;

$$Un = \sum_m (C1m \cdot Hn\text{-}m + jC2m \cdot Hn\text{-}m)$$

wherein Un is of the complex number. Through employment of the equation (1), an output Xk will be represented as;

$$Xk = \sum_n Un \cdot Sk - n \cdot \exp\{-j\omega c(k - n)\} \tag{2}$$

The equation (2) may be further transformed as;

$$Xk = \left(\sum_n Un \cdot \exp(j\omega cn) \cdot Sk - n\right) \times \exp(-j\omega ck) \tag{3}$$

This equation (3) shows that the result of demodulation Xk may be obtained through multiplication of the output of the fixed equalizer with the input signal of Sk and the impulse response of Un·exp (je$\omega$n), by the complex carrier wave exp $(-j\omega ck)$. Accordingly, in the demodulator of FIG. 1, by rendering the impulse responses of the band-pass filters 21 and 22 for the fixed equalizer respectively as an actual part and an imaginary part of the equation Un·exp (j$\omega$cn), similar result as in the demodulator of FIG. 3, may be obtained by the demodulator of FIG. 1.

As described so far, the impulse response for each of the band-pass filters 21 and 22 contains the impulse response Un in which the impulse response Cm of the filter for compensating for the characteristics of circuit lines and the impulse response Hn for the reception filter are folded. Moreover, the impulse response Un, in which the impulse responses of the low-pass filter and the low-pass filter for the fixed equalizer are folded, shows frequency characteristics of the low-pass filter type, but upon multiplication by exp (jωcn), the filters 21 and 22 are to be provided with the frequency characteristics of the band-pass filter type.

In the quadrature amplitude modulation wave demodulator of the present embodiment, the number of filters included is reduced to two units, i.e. to ½ of the number of filters in the conventional arrangement (FIG. 3).

Figure 2:
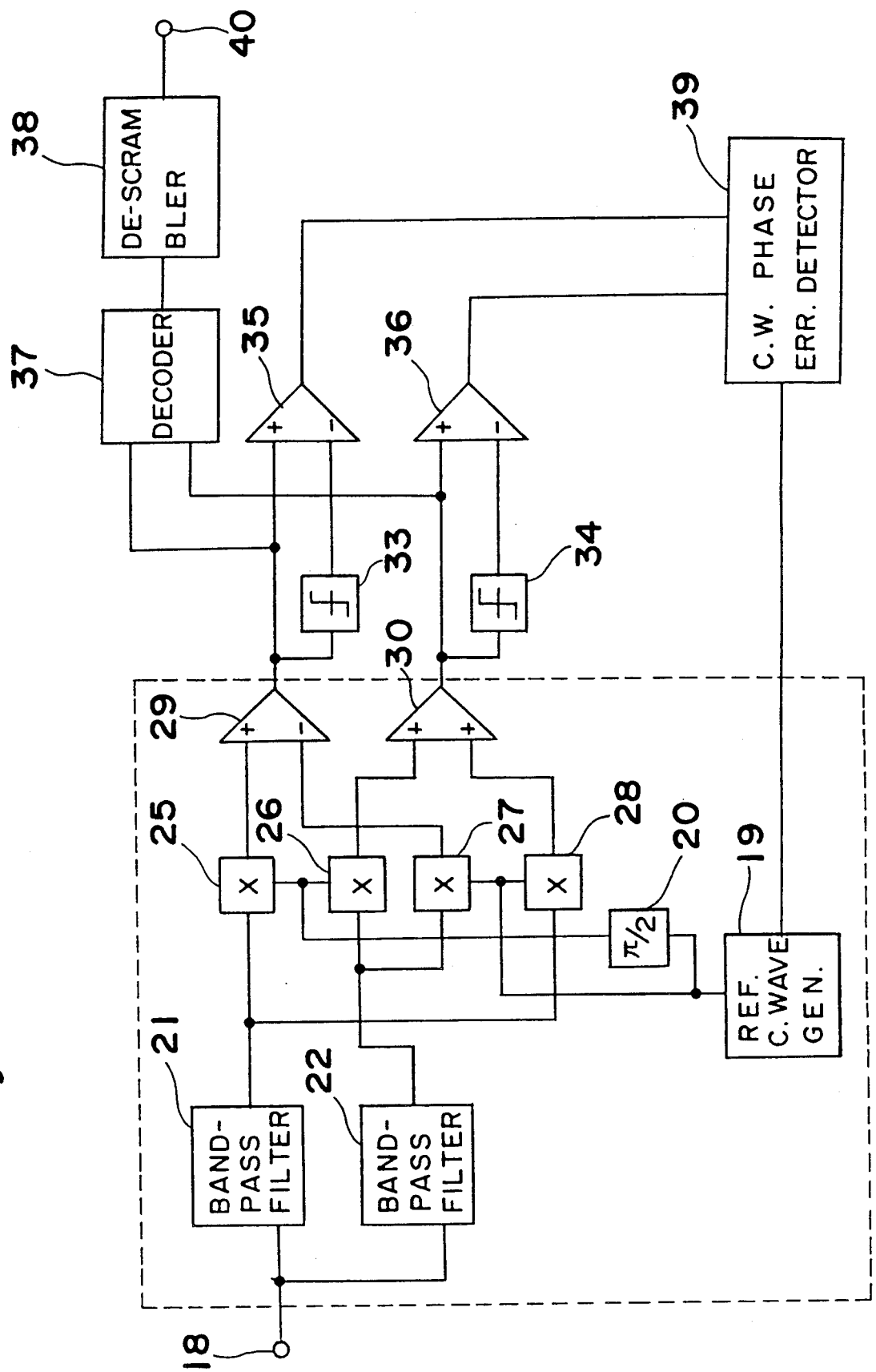
FIG. 2 is a block diagram showing one example of a circuitry in which the quadrture amplitude modulation wave demodulator of FIG. 1 applied to CCITT (International Telegraph and Telephone Consultative Committee) recommended V.29 MODEM (modulator-demodulator).

FIG. 2 shows one example of a circuit in which the quadrature amplitude modulation wave demodulator of FIG. 1 is applied to CCITT recommended V. 29 MODEM.

In FIG. 2, the portion surrounded by dotted lines has the construction similar to that of the demodulator of FIG. 1, and the outputs of the adders 29 and 30 are applied to a decoder 37, the output of which is further applied to a descrambler 38 to produce the reception data at an output terminal 40 of said descrambler. Meanwhile, the output of the adder 29 is directly applied to a non-inverting input terminal of an adder 35 for error detection, and to an inverting input terminal thereof through a data detector 33. Similarly, the output of the adder 30 is directly applied to a non-inverting input terminal of an adder 36 for error detection, and to an inverting input terminal thereof through a data detector 34. A carrier wave phase error detector 39 connected to the output terminals of the adders 35 and 36, and further coupled with the reference carrier wave generator 19, is arranged to control said generator 19 based on the outputs of the adders 35 and 36.

As is clear from the foregoing description, according to the present invention, a quadrature amplitude modulation wave demodulator in which the required number of filters is markedly reduced as compared with the conventional demodulator, and which is provided with improved band-pass filters for the fixed equalizer, has been advantageously provided through simple construction. For actual application of such demodulator, no high speed and large capacity hardware such as DSP, etc. as in the conventional arrangement is required, and thus, a marked reduction in cost may be achieved.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A quadrature amplitude modulation wave demodulator comprising:
    a fixed equalizer having a first band-pass filter for receiving a quadrature amplitude modulation wave reception signal and for outputting an in-phase component with respect to a carrier wave for the reception signal;
    a second band-pass filter for receiving said reception signal and for outputting a quadrature component with respect to the carrier wave for the reception signal; and
    each of said first and second band-pass filters having an impulse response, including an impulse response in which an impulse response of a filter for compensating for the characteristics of communication lines and an impulse response of a reception filter are folded; and
    a vector multiplication section for performing vector multiplication between one vector having outputs of said first and second band-pass filters as two components, and another vector having two reference carrier waves in quadrature to each other as two components.

2. The quadrature amplitude modulation wave demodulator of claim 1, further including a reference carrier wave generator operatively connected to the vector multiplication section for supplying the reference carrier waves.

3. The quadrature amplitude modulation wave demodulator according to claim 2 further including π/2 phase shifter operatively connected between said reference carrier wave generator and said vector multiplying section.

4. An quadrature amplitude modulation wave demodulator for use with a modem comprising:
    a fixed equalizer having a first band-pass for receiving a quadrature amplitude modulation wave reception signal for outputting an in-phase component with respect to a carrier wave for the reception signal;
    a second band-pass filter for receiving said reception signal and for outputting a quadrature component with respect to the carrier wave for the reception signal;
    each of said first and second band-pass filters having an impulse response including an impulse response in which an impulse response of a filter for compensating for the characteristics of communication lines and an impulse response of a reception filter are folded;
    a vector multiplication section for performing vector multiplication between one vector having outputs of said first and second band-pass filters as two components, and another vector having two reference carrier waves in quadrature to each other as two components; and
    a modem operatively connected to said vector multiplication section.

5. The amplitude modulation wave demodulator of claim 4, wherein said modem includes a first and second data detector.

6. The amplitude modulation wave demodulator of claim 5 wherein said first and second data detector are operatively connected to a first and second adder of the multiplication section; and
    said modem includes a first and second adder operatively connected to said first and second data detector.

7. The amplitude modulation wave demodulator of claim 6, wherein said modem includes a carrier wave detector operatively connected to said first and second adders of the modem and to a reference carrier wave generator.

* * * * *